United States Patent
Tao

(10) Patent No.: US 7,037,759 B2
(45) Date of Patent: May 2, 2006

(54) SEMICONDUCTOR PACKAGE AND METHOD FOR MANUFACTURING THE SAME

(75) Inventor: Su Tao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/864,408

(22) Filed: Jun. 10, 2004

(65) Prior Publication Data

US 2004/0251545 A1    Dec. 16, 2004

(30) Foreign Application Priority Data

Jun. 10, 2003    (TW) ................................ 92115684 A

(51) Int. Cl.
*H01L 21/44* (2006.01)

(52) U.S. Cl. ...................... 438/113; 257/620; 257/734; 257/738

(58) Field of Classification Search ................ 257/620, 257/734–738; 438/460–464, 113
See application file for complete search history.

(56) References Cited

U.S. PATENT DOCUMENTS

| | | | | |
|---|---|---|---|---|
| 5,998,238 A | * | 12/1999 | Kosaki | 438/114 |
| 6,040,235 A | | 3/2000 | Badehi | |
| 6,117,707 A | | 9/2000 | Badehi | |
| 6,316,287 B1 | * | 11/2001 | Zandman et al. | 438/113 |
| 6,399,463 B1 | * | 6/2002 | Glenn et al. | 438/463 |
| 6,790,694 B1 | * | 9/2004 | Sugiyama et al. | 438/33 |
| 2003/0190795 A1 | * | 10/2003 | Kawakami | 438/462 |
| 2003/0209772 A1 | * | 11/2003 | Prabhu | 257/434 |
| 2003/0216010 A1 | * | 11/2003 | Atlas | 438/462 |

* cited by examiner

Primary Examiner—Hoai Pham
Assistant Examiner—Nathan W. Ha

(57) ABSTRACT

A semiconductor package comprises a semiconductor chip, a lid, a plurality of traces, a compliant layer, a plurality of conductive pastes, and a plurality of solder pads. The semiconductor chip has an active surface, a backside, and a plurality of bonding pads disposed on the active surface. The lid covers the active surface of the semiconductor chip. The traces are disposed between the lid and the active surface of the semiconductor chip, and are electrically connected to the bonding pads. The compliant layer covers the backside of the semiconductor chip for isolating the traces. The conductive pastes are electrically connected to the traces, and the solder pads are electrically connected to the conductive pastes.

16 Claims, 7 Drawing Sheets

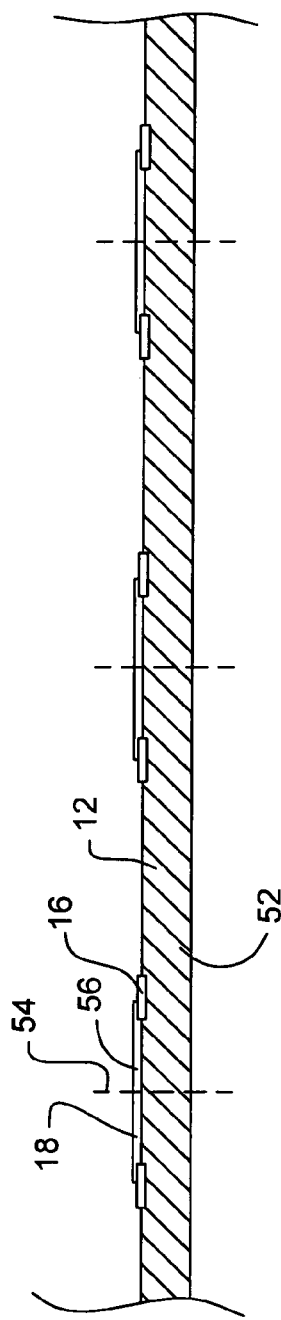
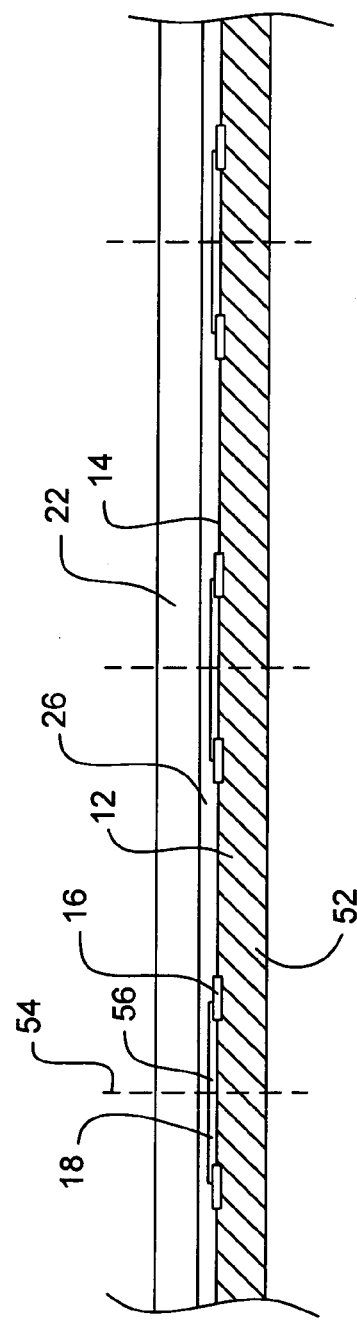

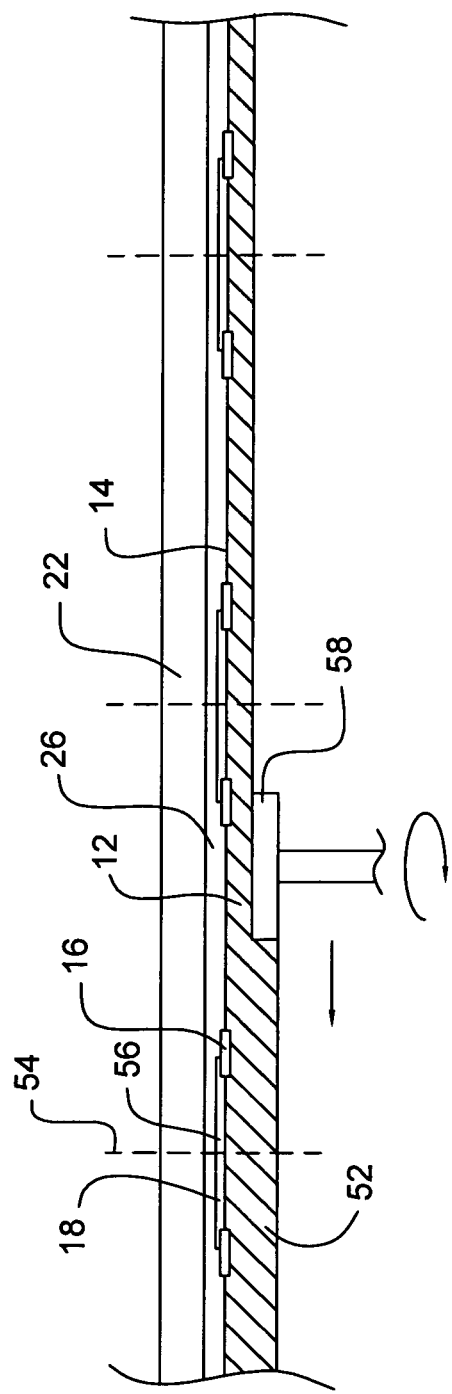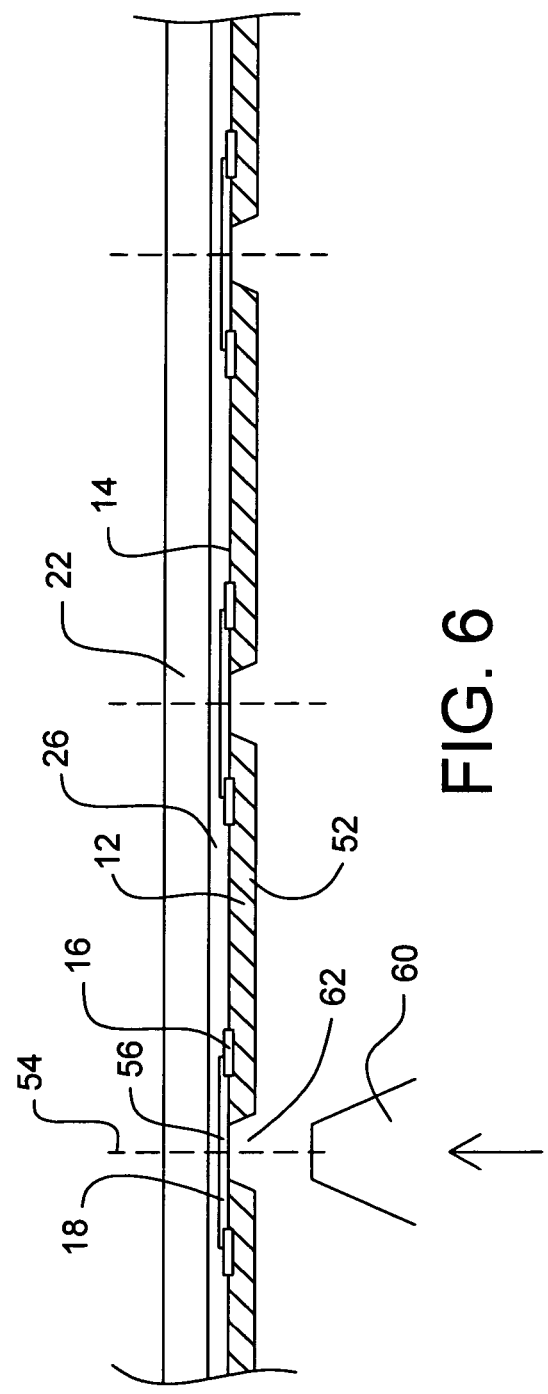

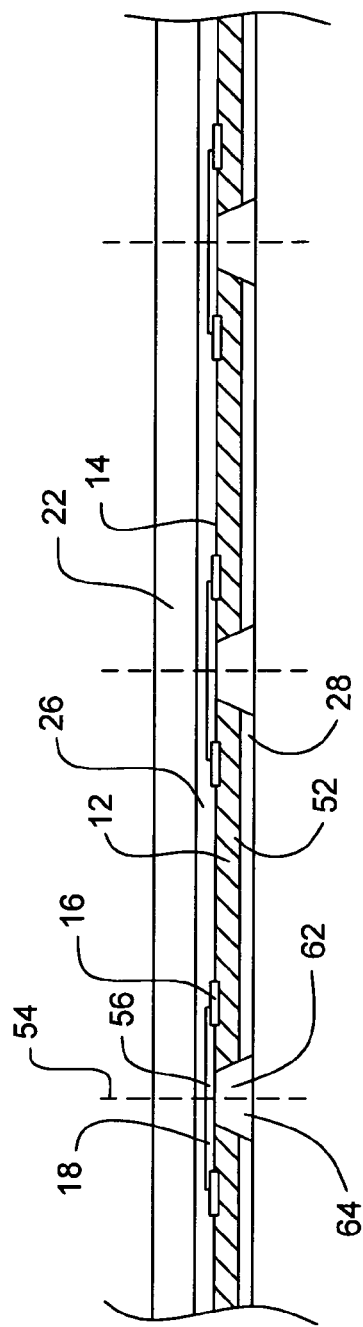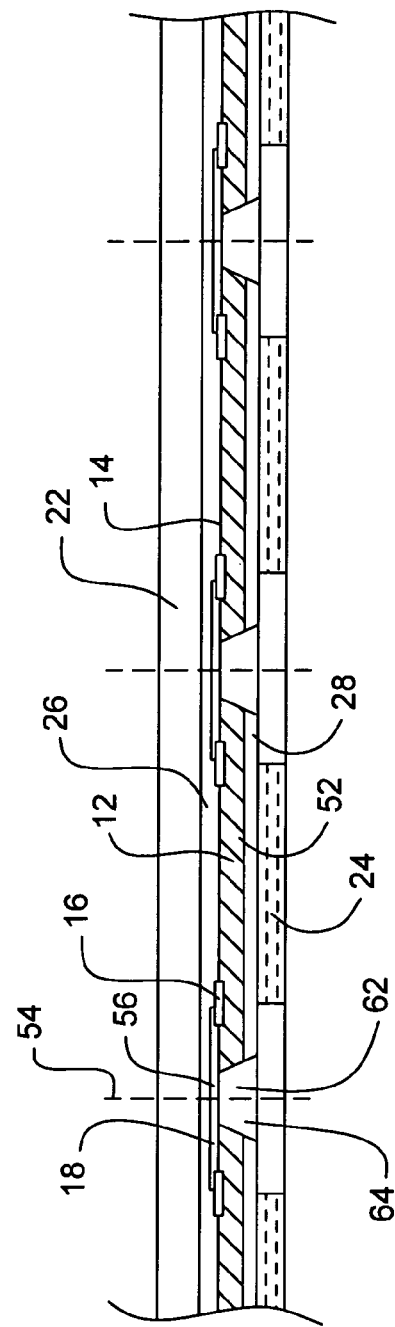

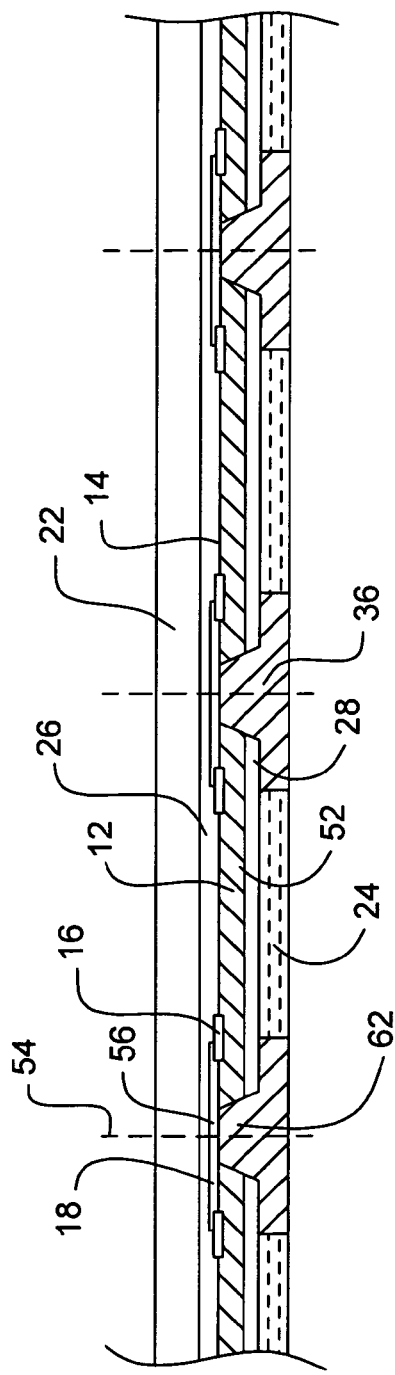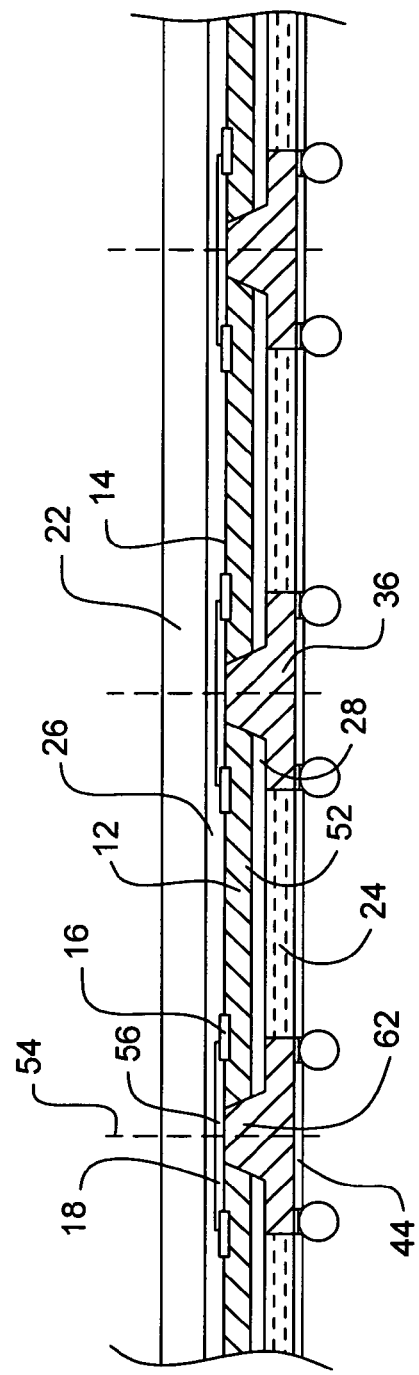

SEMICONDUCTOR PACKAGE AND METHOD FOR MANUFACTURING THE SAME

RELATED APPLICATIONS

The present application is based on, and claims priority from, Taiwan Application Serial Number 092115684, filed Jun. 10, 2003, the disclosure of which is hereby incorporated by reference herein in its entirety.

BACKGROUND OF THE INVENTION

1. Field of the Invention

The present invention relates to a semiconductor package and a method for manufacturing the semiconductor package, and more particularly, to a wafer level semiconductor package and a method for manufacturing the semiconductor package at wafer level.

2. Description of the Related Art

The semiconductor package has four major functions, i.e. signal distribution, power distribution, heat dissipation, and protection. In general, the semiconductor chip is formed into an enclosure, such as a single-chip module (SCM) or a chip carrier, referred to as the packaging of the semiconductor. These packaged chips, along with other components such as capacitors, resistors, inductors, filters, switches, and optical and RF components, are assembled to a printed wiring board.

As the need has arisen for lighter and more complex electronic devices, the velocity and the complexity of IC chip become more and more higher. Accordingly, a need has arisen for higher package efficiency. Prior art attempts have been made to provide various packages and manufacturing methods for increasing the efficiency and the reliability of the package. For example, U.S. Pat. No. 6,040,235 entitled "Methods And Apparatus For Producing Integrated Circuit Devices," issued to Badehi on May 21, 2000, and U.S. Pat. No. 6,117,707 entitled "Methods Of Producing Integrated Circuit Devices," issued to Badehi on Sep. 12, 2000 disclose methods for manufacturing the semiconductor packages. However, the semiconductor package and the manufacturing method in the prior art still have many drawbacks, such as low reliability and electrical performance, large volume, and high manufacturing cost, and the need of semiconductor package was not fulfilled.

Accordingly, there exists a need for a semiconductor package manufactured at wafer level so as to further fulfill the demands of the semiconductor package.

SUMMARY OF THE INVENTION

It is an object of the present invention to provide a semiconductor package and a method for manufacturing the semiconductor package with high package efficiency and small dimension for overcoming the restrictions in the prior art.

In order to achieve the above object, the present invention provides a semiconductor package comprising a semiconductor chip, a lid, a plurality of traces, a compliant layer, a plurality of conductive pastes, and a plurality of solder pads. The semiconductor chip has an active surface, a backside, and a plurality of bonding pads disposed on the active surface. The lid covers the active surface of the semiconductor chip. The traces are disposed between the lid and the active surface of the semiconductor chip, and are electrically connected to the bonding pads. The compliant layer covers the backside of the semiconductor chip for isolating the traces. The conductive pastes are electrically connected to the traces, and the solder pads are electrically connected to the conductive pastes.

BRIEF DESCRIPTION OF THE DRAWINGS

Other objects, advantages, and novel features of the invention will become more apparent from the following detailed description when taken in conjunction with the accompanying drawing.

FIGS. 2–11 are schematic cross-sectional views for showing the manufacturing method of a semiconductor package according to an embodiment of the present invention.

DESCRIPTION OF THE PREFERRED EMBODIMENT

Figure 1:
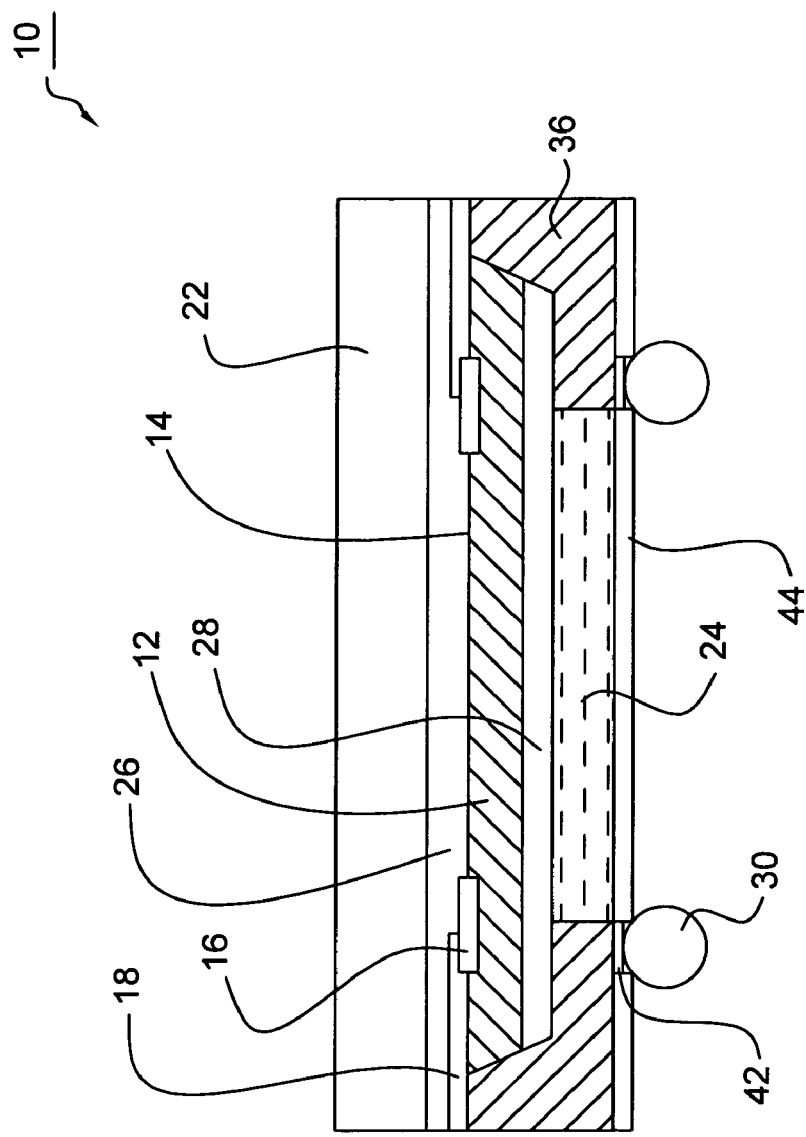
FIG. 1 is a schematic cross-sectional view of a semiconductor package according to an embodiment of the present invention.

Referring to FIG. 1, it depicts a semiconductor package 10 according to an embodiment of the present invention. The semiconductor package 10 comprises a semiconductor chip 12, a lid 22, a compliant layer 28, and a passivation layer 24. The semiconductor chip 12 has an active surface 14 having semiconductor elements (not shown) disposed thereon, and a plurality of bonding pads 16 electrically connected to the semiconductor elements.

The lid 22 is attached to the active surface 14 of the semiconductor chip 12 by an adhesive 26. The semiconductor chip 12 further comprises a plurality of traces 18 electrically connected to the bonding pads 16 and extending to the outside of the chip 12. The compliant layer 28 is disposed on the backside surface and provided with isolators 64 (shown in FIG. 7) disposed between the adjacent traces 18. The passivation layer 24 is disposed on the compliant layer 28 such that circuits are formed on the backside of the semiconductor package 10.

The semiconductor package 10 further comprises a plurality of conductive pastes or epoxies 36 individually connected to the traces 18. It should be noted that there are the compliant layer 28 and the passivation layer 24 between the adjacent conductive pastes 36 for isolation. This arrangement will be described hereinafter. A solder mask 44 is coated on the passivation layer 24 and the conductive pastes 36, and part of the conductive pastes 36 are exposed out of the solder mask 44 for forming the solder pads 42. A plurality of solder balls 30 are disposed on the solder pads 42. The surface of the solder pads 42 may be finished with gold deposit by the electroless plating process or finished by other anti-oxidative treatment.

In this arrangement, the bonding pads 16 of the semiconductor chip 12 are electrically connected to the traces 18 and further electrically connected to the solder balls 30 by way of the conductive pastes 36 so as to achieve the propose of signal distribution and power distribution.

It will be apparent to those skilled in the art that the traces 18 are not essential. The bonding pads 16 can extend to the edges of the semiconductor chip 12, or even to the outside of the semiconductor chip 12, for being electrically connected to the solder pads 42 by way of the conductive pastes 36 (shown in FIG. 12). The compliant layer 28 serves as a stress buffer and also is not essential.

Now referring to FIG. 2 to FIG. 11, they depict the processes for manufacturing the semiconductor package 11 according to the present invention, wherein the same numerals refer to corresponding members throughout.

Figure 2A:
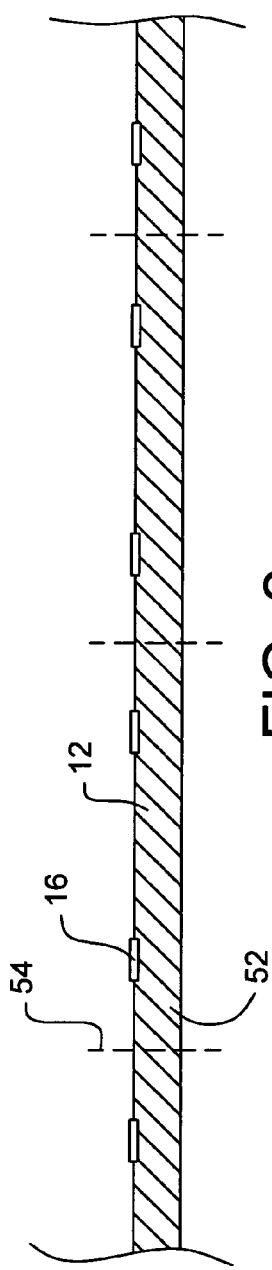
Figure 2B:
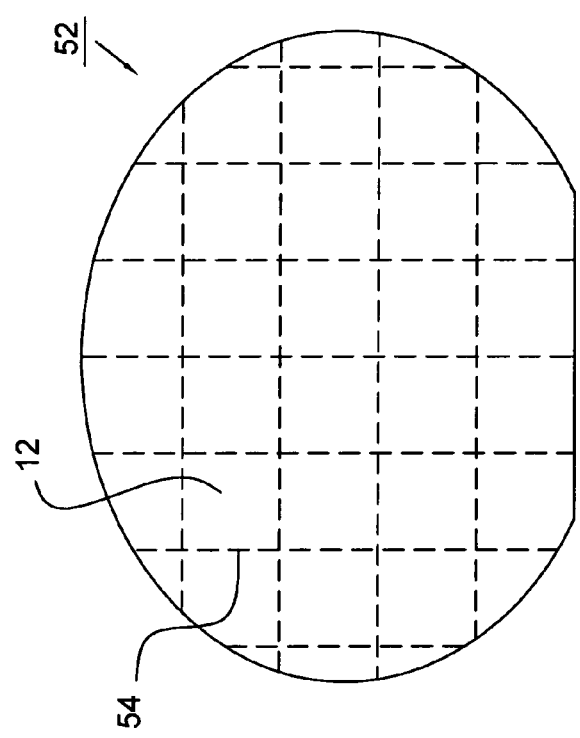

As shown in FIGS. 2a and 2b, a wafer 52 comprises a plurality of semiconductor chips 12 separated from one another by scribe lines 54. A plurality of bonding pads 16 can be disposed on the wafer 52 by a photolithography process. The number of the bonding pads 16 on each of the semiconductor chips 12 depends on the design of input/output circuits on the semiconductor chips 12. As shown in FIG. 3, a metal extension layer 56 is disposed on the wafer 52 for forming metal extensions individually electrically connected to the bonding pads 16 so as to form the traces 18.

As shown in FIG. 4, the wafer 52 is attached to a lid 22 by an adhesive 26. Then, as shown in FIG. 5, the backside of the wafer 52 is ground by a mechanical grinding wheel or chemical grinding process for reducing the thickness of the wafer 52 to a predetermined thickness.

As shown in FIG. 6, a cutting blade 60 cuts the backside of the wafer 52 along predetermined paths for forming notches 62. The predetermined paths can be correspondent to the scribe lines 54 of the wafer 52. Then, an etching process is carried out for exposing the metal extension layer 56.

In an alternative embodiment according to the present invention, after the wafer 52 is attached to the lid 22 by the adhesive 26, a cutting blade 60 can cut the backside of the wafer 52 along predetermined paths correspondent to the scribe lines 54 for forming notches 62. Then, an etching process is carried out for exposing the metal extension layer 56 and reducing the thickness of the wafer 52 to a predetermined thickness. In this embodiment, the grinding step can be eliminated.

As shown in FIG. 7, a compliant layer 28 is coated on the backside of the wafer 52 and the notches 62. The compliant layer 28 is provided with a plurality of isolators 64 extending into the notches 62 and disposed between the adjacent traces 18 for isolating the adjacent traces 18. More specifically, in the notches 62, the spaces between the adjacent traces 18 are filled with the compliant layer 28 for forming the isolator 64, but the compliant layer 28 is not coated on the traces 18. The compliant layer 28 can be formed by photolithography process and made of BCB (benzocyclobutene) resin.

Referring to FIG. 8, a passivation layer 24 is coated on the compliant layer 28 for further forming an electrical pattern or traces on the backside of the wafer 52. Then, as shown in FIG. 9, the spaces between the isolators 64 or the compliant layers 28 in the notch 62 and the spaces in the electrical pattern of the passivation layer 24 are filled with conductive pastes 36. The conductive paste 36 can be made of solder paste or silver paste. The conductive pastes 36 are cured after they are filled into the spaces in the electrical pattern of the passivation layer 24.

According to an alternative embodiment of the present invention, the compliant layer 28 can be eliminated and the passivation layer 24 is coated on the backside of the wafer 52 and in the notches 62. The passivation layer 24 is further provided with a plurality of isolators extending into the notches 62 and disposed between the adjacent traces 18 for isolating the adjacent traces 18. Also, the passivation layer 24 is coated on the backside of the wafer 52 for forming the electrical pattern. In the notches 62, the spaces in the passivation layer 24 is filled with the conductive pastes 36.

Referring to FIG. 10, a solder mask 44 is coated on the passivation layer 24 and partly covers the conductive pastes 36. A plurality of solder pads 42 are formed on the conductive pastes 36 and then a plurality of solder balls 32 are disposed on the solder pads 42. In addition, the surface of the solder pads 42 can be finished with the gold deposit by the electroless plating process or finished by other anti-oxidative treatment.

Figure 11:
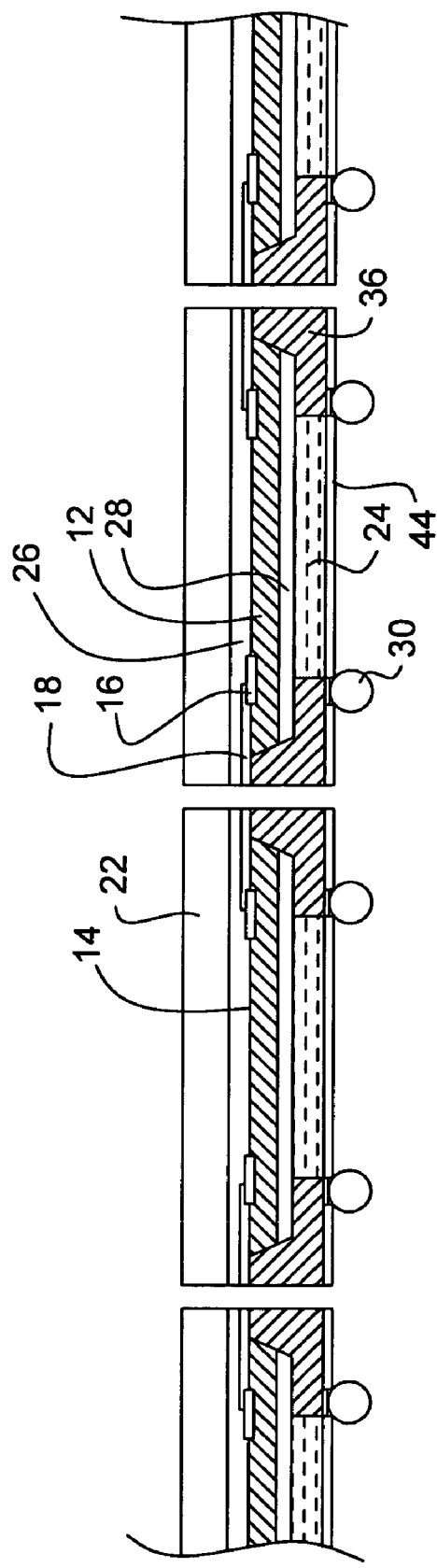

Now referring to FIG. 11, a wafer cutting process is carried out along the scribe lines 54 of the wafer 52 for singulating the wafer 52 into the semiconductor packages 10. As shown in the drawings, after the cutting process or the singulation process, the metal extension layer 56 serves as the traces 18 of the semiconductor chip 12.

It will be apparent to those skilled in the art that the metal extension layer 56 is not essential. The bonding pads 16 of the semiconductor chip 12 can be disposed on the edges of the semiconductor chip 12 and can be exposed after the forming process of the notches 62 and the etching process. Then, the solder pads are formed on the conductive pastes 36 for being connected to the solder balls 32.

It will be apparent to those skilled in the art that the active surface of the semiconductor chip 12 is covered by the lid 22 which may be made of transparent material, such as glass, acrylic resin or sapphire, so that light can be transmitted through the lid 22 and interact with the semiconductor elements of the semiconductor chip 12.

As indicated in the above-mentioned description, in the manufacturing method of the semiconductor package according to the present invention, the semiconductor package can be mass-produced at the wafer level so that the manufacturing cost is reduced and the reliability of the semiconductor package is increased. Furthermore, the semiconductor package according to the present invention can be adapted to an optical element package.

While the foregoing description and drawings represent the preferred embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A method for manufacturing a semiconductor package, comprising the following steps of:

providing a wafer defining an active surface and a backside and having a plurality of semiconductor chips each having a plurality of bonding pads disposed on the active surface, and a plurality of scribe lines disposed between the chips;

forming a plurality of metal extension traces on the active surface of the wafer and electrically connecting the metal extension traces to the bonding pads;

covering the active surface of the wafer with a lid;

forming a plurality of notches along the scribe lines and exposing the metal extension traces;

covering the backside of the semiconductor chip with a passivation layer and disposing the passivation layer between the adjacent metal extension traces in the notches, while leaving said metal extension traces exposed in the notches;

filling up the notches with conductive pastes being electrically connected to the metal extension traces; and singulating the wafer.

2. The method for manufacturing the semiconductor package as claimed in claim 1, wherein the lid is made of transparent material.

3. The method for manufacturing the semiconductor package as claimed in claim 1, further comprising the following step of:

covering the backside of the wafer with a compliant layer and disposing the compliant layer between the adjacent bonding pads in the notches, wherein the passivation layer covers the compliant layer.

4. The method for manufacturing the semiconductor package as claimed in claim 1, further comprising the following step of:

disposing a plurality of solder balls on the conductive pastes and electrically connecting the solder balls to the conductive pastes.

5. The method for manufacturing the semiconductor package as claimed in claim 1, further comprising the following step of:

partly covering the passivation layer and the conductive pastes with a solder mask.

6. The method for manufacturing the semiconductor package as claimed in claim 1, wherein the conductive paste is made of solder paste.

7. The method for manufacturing the semiconductor package as claimed in claim 1, wherein the conductive paste is made of silver paste.

8. The method for manufacturing the semiconductor package as claimed in claim 1, wherein the step of forming the notches further comprises the following steps of:

cutting the backside of the wafer along the scribe line for forming the notch, and etching the notch for exposing the metal extension traces.

9. A method for manufacturing a semiconductor package, comprising the following steps of:

providing a wafer defining an active surface and a backside and having a plurality of semiconductor chips each having a plurality of bonding pads disposed on the active surface, and a plurality of scribe lines disposed between the chips;

covering the active surface of the wafer with a lid;

forming a plurality of notches along the scribe lines and exposing the bonding pads of the chips of the wafer;

covering the backside of the semiconductor chip with a passivation layer and disposing the passivation layer between the adjacent bonding pads in the notches, while leaving said bonding pads exposed in the notches;

filling up the notches with conductive pastes being electrically connected to the bonding pads; and singulating the wafer.

10. The method for manufacturing the semiconductor package as claimed in claim 9, wherein the lid is made of transparent material.

11. The method for manufacturing the semiconductor package as claimed in claim 9, further comprising the following step of:

covering the backside of the wafer with a compliant layer and disposing the compliant layer between the adjacent bonding pads in the notches, wherein the passivation layer covers the compliant layer.

12. The method for manufacturing the semiconductor package as claimed in claim 9, further comprising the following step of:

disposing a plurality of solder balls on the conductive pastes and electrically connecting the solder balls to the conductive pastes.

13. The method for manufacturing the semiconductor package as claimed in claim 9, further comprising the following step of:

partly covering the passivation layer and the conductive pastes with a solder mask.

14. The method for manufacturing the semiconductor package as claimed in claim 9, wherein the conductive paste is made of solder paste.

15. The method for manufacturing the semiconductor package as claimed in claim 9, wherein the conductive paste is made of silver paste.

16. The method for manufacturing the semiconductor package as claimed in claim 9, wherein the step of forming the notches further comprises the following steps of:

cutting the backside of the wafer along the scribe line for forming the notch; and etching the notch for exposing the metal extension traces.

* * * * *